Dec. 2, 1969 RICHARD C. CHU 3,481,393

MODULAR COOLING SYSTEM

Filed Jan. 15, 1968 2 Sheets-Sheet 1

INVENTOR
RICHARD C. CHU

BY Harold H Sweeney Jr.
ATTORNEY

MODULAR COOLING SYSTEM

Filed Jan. 15, 1968

2 Sheets-Sheet 2

United States Patent Office 3,481,393
Patented Dec. 2, 1969

3,481,393

MODULAR COOLING SYSTEM

Richard C. Chu, Poughkeepsie, N.Y., assignor to International Business Machines Corporation, Armonk, N.Y., a corporation of New York Filed Jan. 15, 1968, Ser. No. 697,679
Int. Cl. F28f 7/00; F28d 15/00; F25b 21/02
U.S. Cl. 165—80 7 Claims

ABSTRACT OF THE DISCLOSURE

Series connected modular cooling chambers are provided each having a flat heat conducting side which is adapted for attachment to a respective flat backplate of an electronic module to provide good heat conduction to a cooling fluid circulating within the chambers. Flexible conduit is connected between the outlet and inlet of succeeding cooling chambers in the series so that the chambers can be adapted to electronic modules of different heights and can be easily detached from the backplate without interrupting the coolant fluid flow therethrough so that the underlying electronic module can be tested, repaired or replaced without affecting the cooling of other modules in the series.

This invention relates to a cooling system, and more particularly to a liquid cooling system of modular construction for cooling modular electronic components of varying size and powers wherein the modular electronic components may be serviced or removed without affecting the cooling system and wherein temperature may be controlled on the individual modular level.

It is known that the reliability of electronic devices such as semiconductor transistors or diodes decrease with increasing temperature. Also, it is known that the operating characteristics of such devices vary appreciably over the temperature range of operation so that the performance will begin to deteriorate to a degree rendering the device unusable for many purposes long before such a temperature causing a complete failure has been reached.

The general means utilized to provide cooling for electronic components such as semiconductor devices has been a heat sink. The heat sink usually takes the form of a heat conducting plate to which the electronic device to be cooled is attached in heat conducting relationship. As the density of electronic components has increased, the necessity for more efficient cooling means has become necessary. One such means has been to mount the electronic components or modules carrying the components directly to one side of a large cold plate which may be cooled by passing a cool liquid over the other side thereof. Such an arrangement has produced a number of problems, the most prominent of which is the inaccessibility of the electronic module. To replace or service one of these modules it is necessary to remove the cold plate or disconnect all the modules from the circuit board located parallel to the face of the modules opposite to the face connected to the cold plate and thus the cooling of other modules or the electrical operation thereof is interrupted. Another problem has been to obtain a flush fit of each of the electronic modules on the large surface of the cold plate so that there is good heat conduction therebetween. A further problem has been the limitation on size of the modules, especially of the plug in type, in that each module must be of the same height in order to be adaptable to the common cold plate. A further serious limitation is that each of the electronic modules connected to a common cold plate must necessarily be of substantially the same power requirements since there is no local means of varying the cooling available.

Accordingly, these disadvantages of the prior art are overcome by providing a modular cooling system for modular electronic devices which efficiently dissipates the heat generated during the operation of the devices.

Another object of the present invention is to provide an improved liquid cooling system for modular mounted electronic components in which the modular components can be serviced or replaced without interrupting the cooling or electrical operation of other modular components.

A further object of the present invention is to provide an improved modular cooling system which reduces surface matching and contact problems to a more manageable scale so that the mating of the electronic module and the cooling system is technically and economically feasible.

An additional object of the present invention is to provide a liquid cooling system which is adaptable to electronic modules having different heights.

Another object of the present invention is to provide an improved cooling system which is adaptable to electronic modules having different heat dissipating requirements.

In accordance with the present invention, there is provided a cooling system for modular packaged electronic components in which series connected modular cooling chambers are mounted flush with respective heat conductive backplates of modules upon which the electronic components are mounted. Each modular cooling chamber contains an inlet and outlet connector, the outlet of one chamber being connected to the inlet of the succeeding chamber by a flexible conduit. The coolant passing through the series connected modular cooling chambers removes the heat by convection. A heat exchanger for cooling the circulating coolant liquid is included in a circulating system which is connected between the output of the last chamber in the series and the first chamber.

The foregoing and other objects, features and advantages of the invention will be apparent from the following and more particular description of a preferred embodiment of the invention, as illustrated in the accompanying drawings.

Figure 1:
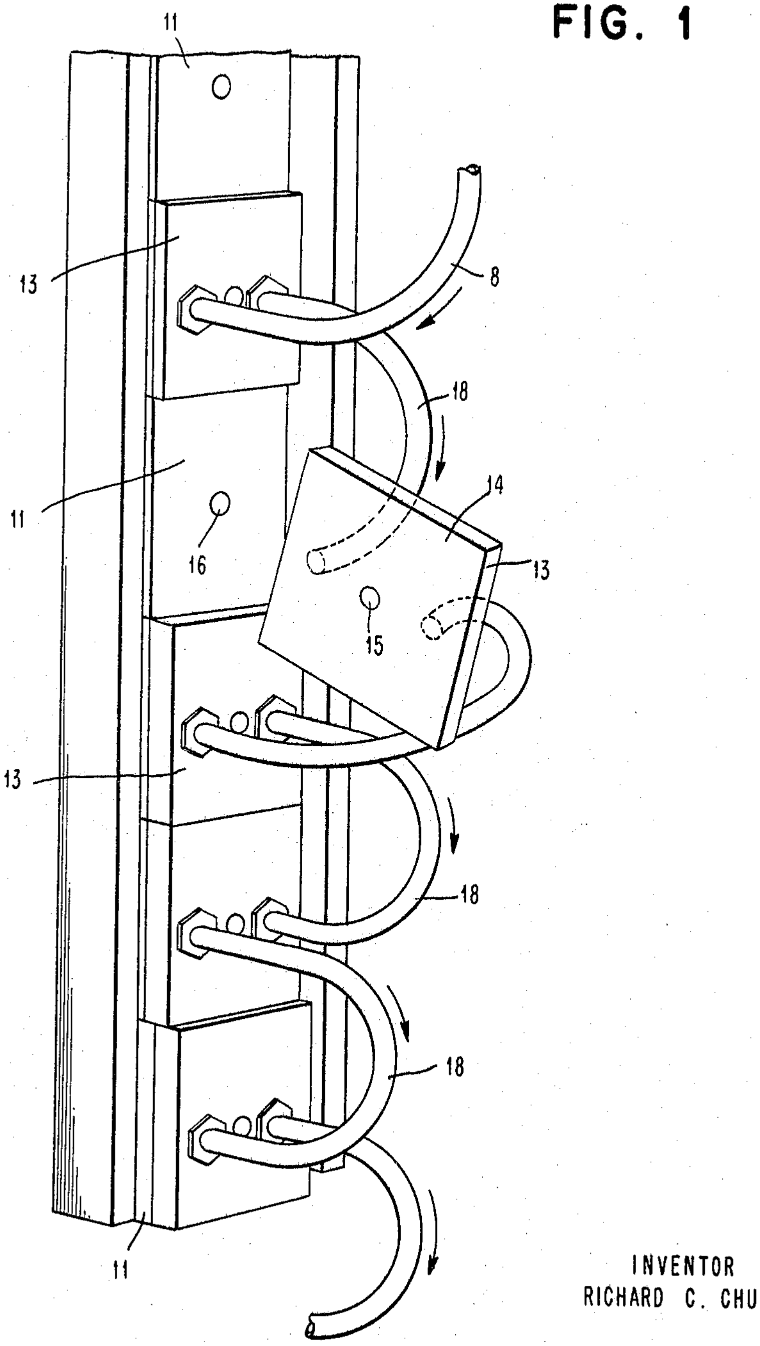
FIG. 1 is a perspective view of an embodiment of the present invention showing one of the cooling chambers disconnected from the backplate of the heat generating module.

Referring to FIG. 1, there is shown a schematic representation of a portion of a string of series connected cooling chambers 13 for providing cooling to modular packaged electronic components such as semi-conductor devices. The electronic components are generally of the plug-in type and are arranged on the other side of heat conducting backplates 11. Each of the backplates 11 has attached thereto a cooling chamber 13 which has a flat head conducting surface 14 of substantially the same area as the flat backplate surface 11. The flat conducting surface or side 14 of the cooling chamber 13 is fitted against the backplate 11 and connected thereto. It is important that the backplate 11 and the conducting side 14 of the cooling chamber 13 fit flush so that a good heat conduction path is established. The cooling chamber 13 is connected to the flat plate 11 via the hole 15 which extends through the cooling chamber 13 and which is indexed with a corresponding hole 16 in the backplate 11 when the chamber 13 is correctly positioned therewith. The hole 15 through the chamber 13, of course, has side walls such that the chamber 13 is maintained closed and no leakage problems are encountered. A variety of connecting means can be utilized, the most simple of which is a screw 17 which may be utilized to connect the chambers 13 to the backplates 11. The use of the small cooling chambers 13 made to fit corresponding small flat plates 11 for each module has the economic advantage that the small areas involved can be made flat to give a good flush fit which is rather hard to do economically when the backplate 11 is to be connected to a common cold plate which covers a large surface area. Flexible hoses 18 are connected to the input connectors 19 and output connectors 21 of each of the cooling chambers 13 with the output connector 21 of each cooling chamber 13 connected to the input connector 19 of the succeeding chamber 13. The input or output connectors 19, 21 are identical and connections thereto interchangeable since it is immaterial which way the liquid flows through the chamber. This arrangement provides a series connected plurality of cooling chambers 13. One important advantage that is derived from utilizing the flexible hose 18 connections between an output of one and an input of the next succeeding cooling chamber 13 is that the chamber 13, as shown in FIG. 1, can be individually disconnected from its corresponding backplate 11. Thus the module connected to the backplate 11 can be unplugged or can be repaired or replaced without interrupting the cooling of the other modules in the series. The cooling fluid, such as water, flows into and out of each of the cooling chambers 13 as indicated by the arrows on FIG. 1. It will be appreciated that the coolant continues to flow through the cooling chamber 13 which is not connected to its backplate 11, as shown in FIG. 1. Thus, one advantage of the flexible hose 18 connections to the modular cooling chambers 13 is that each cooling chamber 13 can be individually detached from its backplate 11 without affecting the cooling of the other modules in the series. Thus, access to the associated electronic module is provided for servicing or replacing.

It should also be noted in connection with FIG. 1, that the backplates 11 of the electronic modules do not necessarily have to lie in the same plane. As a matter of fact, the backplates 11 do not necessarily have to be parallel to one another. Thus, an electronic module of a different height, due probably to a different power requirement, can be utilized which has not been the case in connection with the usual prior art cold plate approach utilized in cooling. For example, a power regulation module may have a different height than the logic modules, thus there is no limitation to where the power regulator module or other high power modules can be placed with respect to the other modules since the cooling arrangement is easily adaptable to the different size or height of modules by virtue of the flexible hose connections 18. In FIG. 1, the last module in the series is shown as having a greater height than the preceding modules in the series. It should also be noted in connection with FIG. 1, that the first cooling chamber 13 of the series has a smaller thickness than the other cooling chambers 13 in the series. This is included to indicate that the chambers 13 can be varied in thickness to provide a further control over the cooling capabilities. The thinner or less thick cooling chamber 13 requires a faster flow therethrough of the liquid which is maintained under a fixed pressure in the system. Consequently, the increased flow rate increases the convection heat removal from the conducting wall of the cooling chamber 13. Thus, a further control over the heat removal from the module is introduced by controlling the thickness dimension of the cooling chamber 13.

Figure 3:
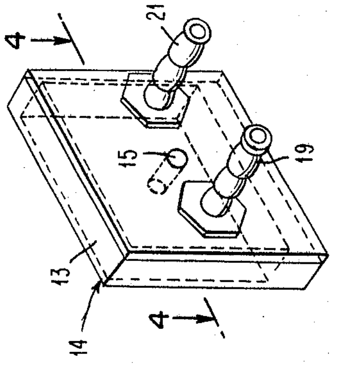
FIG. 3 is a perspective view of one of the cooling chambers showing the inlet and outlet connectors attached thereto.

Referring to FIG. 3, there is shown an enlarged perspective view of one of the cooling chambers 13 which is utilized in the modular conduction cooling system. The hole 15 extending through the chamber 13 is shown in dotted form in the center thereof. The input and output connectors 19, 21 are ridged or knurled to apply pressure to the hose 18 placed thereon to prevent its slipping from the connector unaided. It is known in connection with the prior art larger cold plates, that the input and output area, that is the area around the input and output connector 19, 21 provides a higher heat transfer coefficient. The reason for this higher heat transfer is due to the turbulence created by the expansion or contraction of the liquid in the area surrounding the input and output connector 19, 21 openings. These areas are relatively small, but fill practically the entire chamber of the small modular cooling chambers 13 of the instant invention. It will be appreciated, that we have increased the number of input and output connectors 19, 21 and accordingly, the input and output higher heat transfer areas.

Figure 2:
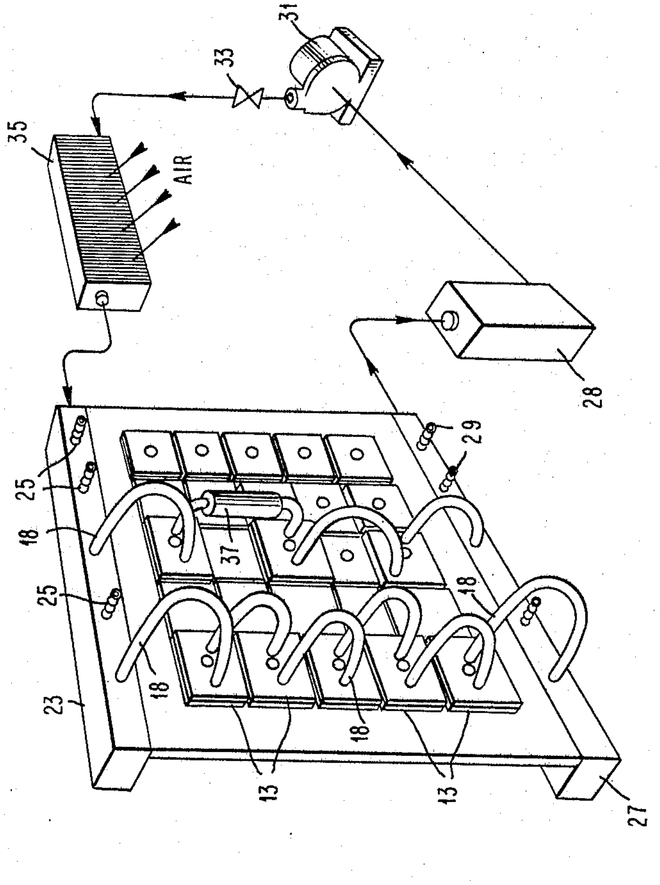
FIG. 2 is a schematic perspective view of the modular conduction cooling system including the embodiment as shown in FIG. 1.

A schematic representation, not to scale, is shown in FIG. 2 of the entire heat exchange system which is utilized in connection with the series arrangement of cooling chambers 13 described in connection with FIG. 1. A plurality of these series connected strings of cooling chambers 13 is shown in FIG. 2. The arrangement consists of an input manifold 23 by means of which the cooling fluid first enters the structure in which the electronic modules to be cooled are arranged. The input manifold 23 contains a number of outlets 25 along its length to which the input flexible hose 18 of the first cooling chamber 13 in each series of cooling chambers is connected. Likewise, the arrangement contains an output manifold 27 with a corresponding placement in number of openings 29 therein to which is connected the output flexible hose 18 from the output connector 21 of the last cooling chamber 13 in each of the series. Thus, the cooling path is through each of the parallel connected series arrangement of cooling chambers 13 which extend between the input and output manifolds 23, 27. The cooling liquid from the output manifold 27 flows to an expansion tank 28 at which the volume changes due to the expansion and contraction of the liquid is provided for as is done in connection with any liquid cooling arrangement. The output of the expansion tank 28 is connected to the circulating pump 31 by means of which the fluid is continually circulated. A valve 33 is shown connected in the flow line following the pump 31. This valve 33 controls the rate of flow of cooling liquid in the system. As the cooling fluid picks up the heat from the electronic modules in the individual cooling chambers 13, it must be cooled somewhere in the system. This cooling is provided by a heat exchanger 35 which is connected following the rate of flow adjusting valve 33. This is the type heat exchanger in which air is forced over cooling fins connected with the heat exchanger 35 to provide cooling of the liquid flowing therethrough. The output of the heat exchanger 35 connects the cooled cooling liquid to the input manifold 23 of the cooling system. Thus we have a conventional closed loop system in which the heat is absorbed in one place and exchanged by a heat exchanger at a remote location. It is apparent that the rate of flow through the parallel paths of the series connected cooling chambers 13 will not necessarily be equal since the series string or parallel path closest to the input of the input manifold 23 will tend to have the greater flow rate. This is not detrimental to the operation of the cooling system since the parallel strings of series connected cooling chambers 13 operate satisfactorily at various flow rates as long as the flow rates are above a predetermined operation minimum. Of course, flow balancing devices 37 may be introduced to equalize the flow rate through the successive parallel strings of series cooling chambers 13.

These flow balancing devices 37 introduce resistance to flow where needed.

Figure 4:
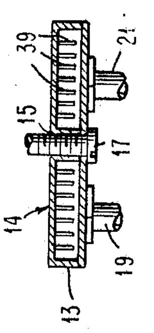
FIG. 4 is a view taken along the line 4—4 of FIG. 3 and also including inner cooling fins.

Referring to FIG. 4, there is shown a horizontal sectional view of the individual cooling chamber 13 as seen in FIG. 3. This figure includes cooling fins 39 within the cooling chamber 13. This increases the heat transfer coefficient by providing more area over which the liquid contacts the heat conductive surface. Thus, a higher power module can be successfully cooled by the use of a finned cooling chamber.

Figure 5:
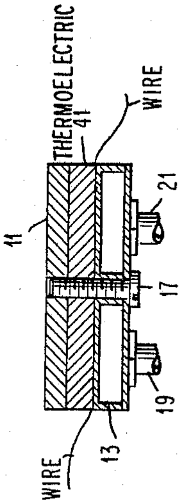
FIG. 5 is a schematic horizontal sectional view of the cooling chamber, electronic module and a thermoelectric device included therebetween.

A further innovation of this cooling arrangement is shown in FIG. 5. A thermoelectric cooling device 41 is shown inserted between the conducting side of the cooling chamber 13 and the backplate 11 of the electronic module. The thermoelectric module would only be used in those situations where close control or increased heat removal for high power electronic modules is desired. As is well known, the thermoelectric module is a semiconductor device which electronically produces a controlled cold side and a corresponding hot side. The cold side, which can be made considerably colder than the cooling liquid used, faces the electronic module so that the heat transfer is enhanced from the electronic module backplate to the cold side of the thermoelectric device 41. The temperature and accordingly the rate of heat transfer is easily controlled by varying the current applied to the thermoelectric device 41. Thus, a further local means of controlling the rate of heat transfer from preselected modules is provided. This allows high power modules which require close regulation to be included wherever desired with the other modules in the system.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A cooling system for modular constructed heat generating electronic components comprising:

a plurality of heat conductive backplates upon which components are mounted, respectively;

a plurality of series connected modular cooling chambers each having a heat conductive side of substantially the same area as a respective one of said electronic module backplates and each adapted to fit flush against said respective module backplate to provide good heat conduction therebetween;

means to releasably connect each of said heat conductive backplates with its respective modular cooling chamber;

an inlet and outlet connector on each of said cooling chambers;

flexible conduit connecting the outlet of each cooling chamber to the inlet of the succeeding chamber so that each of said chambers can be individually displaced from its backplate;

a liquid coolant for passing through said series connected modular cooling chambers and;

a circulating system connected between the flexible conduit connected to the outlet on the last cooling chamber and the flexible conduit connected to the inlet connector on the first cooling chamber in said series connected modular cooling chambers for circulating said coolant through said series connected modular cooling chambers, said circulating system including a heat exchanger for removing heat from said coolant.

2. A cooling system according to claim 1, wherein each of said heat conductive backplates and said heat conducting side of each of said modular cooling chambers are flat and meet over substantially the entire abutting area for good heat transfer.

3. A cooling system according to claim 1, wherein a thermoelectric device is connected between said backplate and said heat conducting side of said modular cooling chamber to provide local control of cooling for preselected high power modules.

4. A cooling system according to claim 1, wherein said backplates of said electronic modules are located parallel to one another, said electronic modules having varying heights and accordingly the backplates are located in planes determined by said electronic module height, the flexible conduits extending between outlet connectors and inlet connectors on successive cooling chambers being sufficiently long so that said cooling chambers can be fitted flush against said backplates in said different planes.

5. A cooling system according to claim 1, wherein the distance between said heat conducting side of said chamber mating with said backplate and the side parallel thereto may be varied from chamber to chamber to provide another control over the rate of cooling, the chambers having a smaller distance between said sides causing a more rapid flow of said fluid therethrough and consequently a greater heat transfer to said coolant liquid.

6. A cooling system according to claim 1, wherein said chamber has an open ended channel running thereacross from said heat conducting side to the side parallel thereto for receiving attaching means adapted to attach said chamber flush to said backplate, said chamber when unattached being movable away from said backplate by virtue of said flexible hose so that said module can be repaired or replaced.

7. A cooling system according to claim 1, wherein an input and output manifold means are provided connected to the flexible conduit which is connected to the input connector of the first coolant chamber in said series and connected to the flexible conduit connected to the outlet connector of the last coolant chamber in said series respectively, a plurality of parallel strings of series connected cooling chambers attached at each end thereof to a respective one of said manifolds.

References Cited

UNITED STATES PATENTS

| | | | |
|---|---|---|---|
| 2,179,293 | 11/1939 | Hein | 317—234 X |
| 2,692,961 | 10/1954 | Fondiller | 317—100 |
| 2,717,319 | 9/1955 | Bundy | 174—15 X |
| 2,942,165 | 6/1960 | Jackson et al. | 317—234 |
| 3,004,196 | 10/1961 | Drexel | 317—234 |
| 3,275,921 | 9/1966 | Fellendorf et al. | 317—234 X |
| 3,334,684 | 8/1967 | Roush et al. | 317—100 X |
| 3,400,543 | 9/1968 | Ross | 165—80 X |

FOREIGN PATENTS 796,763 6/1958 Great Britain.

ROBERT A. O'LEARY, Primary Examiner

A. W. DAVIS, Assistant Examiner

U.S. Cl. X.R.

62—3; 165—107; 174—5; 317—100, 234